United States Patent [19]

Clark

[11] Patent Number: 4,525,062
[45] Date of Patent: Jun. 25, 1985

[54] POSITIONING JIG FOR POSITIONING COPY MATERIAL FOR OFFSET PRINTING

[76] Inventor: Alfred L. Clark, P.O. Box 53, Zionsville, Ind. 46077

[21] Appl. No.: 530,969

[22] Filed: Sep. 12, 1983

[51] Int. Cl.³ .................... G03B 27/42; G03B 27/58
[52] U.S. Cl. ........................................ 355/72; 355/53
[58] Field of Search ................... 355/53, 54, 72, 74, 355/75

[56] References Cited

U.S. PATENT DOCUMENTS

| | | | |
|---|---|---|---|
| 2,600,809 | 6/1952 | Simmons | 355/74 |
| 4,016,577 | 4/1977 | Hensy et al. | 355/72 X |
| 4,095,893 | 6/1978 | Handsman | 355/74 |
| 4,155,644 | 5/1979 | Hess | 355/72 |

Primary Examiner—Richard A. Wintercorn
Attorney, Agent, or Firm—Woodard, Weikart, Emhardt & Naughton

[57] ABSTRACT

A positioning jig for positioning copy material on the copybord of an offset print plate maker in order to make a photographic print plate bearing an accurately aligned image of the copy material. The positioning jig is provided with means for accurately positioning the copy material without the positioning stops casting an image which is photographically perceptible by the plate maker. The positioning jig includes a base having a substantially flat top facing surface defining a plurality of recessed positioning stops. Each of the positioning stops includes a pair of mutually perpendicular side walls having a relatively low height with respect to the length of the side walls. The base is formed by blasting a transparent acrylic sheet with an 80 grit aluminum oxide material so that the top facing surface is sufficiently irregular to permit light striking the surface to become randomly diffused in the base.

17 Claims, 19 Drawing Figures

POSITIONING JIG FOR POSITIONING COPY MATERIAL FOR OFFSET PRINTING

BACKGROUND OF THE INVENTION

The invention relates generally to the field of offset printing and, more specifically, to positioning jigs which are useful for accurately positioning copy material in a photographic print plate maker.

Previous methods for offset printing involve making a photographic negative of the original print material from which the offset print plate is then made. More recently, photo-direct plate makers have been developed which eliminate the intermediate step of making a photographic negative of the original print material. Because they are less expensive to own and operate than other types of print plate makers, photo-direct plate makers have found wide acceptance and use in such business as "Quick-print" shops.

Whether the plate maker is one that produces negative images or is the photo-direct type, accurate alignment of the copy material or ready copy is important in order that the offset print plate can reproduce copies having script which is accurately aligned with the borders of the paper. Accordingly, existing plate makers commonly have positioning lines inscribed on the top facing surface of the copyboard to assist the operator in aligning the copy material. Visual alignment of the copy material is, however, inherently inaccurate and time consuming. Further, due to the size of the copyboard and the shape of the plate maker, it is difficult, if not impossible, for the operator to attain a position directly overhead of the copy material from which accurate visual alignment of the ready copy can be made. As a result, the operator must align the copy material with the positioning lines from a position which is oblique to the line of the camera. The difficulty associated with accurately aligning the copy material from such a position is readily apparent.

In addition to printing copies of larger size documents such as resumes, pamphlets, advertisements, circulars, etc., printers and particularly "Quick-print" shops are frequently called upon to print relatively smaller items which occupy considerably less than the 8 ½" by 11" standard letter size page. One such frequently printed item are business cards, which characteristically have a 2" by 3 ½" standard size. Since most printing equipment is not adapted to print on such small sized paper, business cards are printed on 8 ½" by 11" standard letter size sheets. If only a relatively small number of cards are desired many print shops will print the cards one to a sheet, most of the area of the sheet being wasted material after the actual copy is cut from the sheet. This practice is obviously not economical from the standpoint of the amount of paper which is wasted.

If a relatively large number of business cards or other similar small size copy material is desired, it becomes even more economical to prepare a print plate having thereon several copies of the material to be printed. However, in such situations it is critical that the copies on the print plate be accurately positioned with respect to each other in order that the print material on the printed cards will be properly aligned with the borders of the card. The need for accurate positioning of the copy material in making such a print plate has required that considerable time be spent in alignment, and is for this reason an added cost and a disadvantage.

The technique of placing a plurality of images on a single plate, using only one original, is referred to as "step and repeat". Present methods for making a photographic print plate bearing a plurality of images of the original print material involve making several copies of the original print material from a photographic copier machine and then cutting and pasting the several copies together on one sheet for a single exposure. Another method involves the use of a complicated, costly and time consuming "pin system". "Step and repeat" has also been attempted, more crudely, by measurement location on the copyboard. Methods, such as those just described, are time consuming and require accurate visual alignment of the multiple copies with respect to each other so that the printed material can be easily cut into individual sheets. Due to these disadvantages, "step and repeat" has had very limited acceptance in the quick print industry.

SUMMARY OF THE INVENTION

One embodiment of the present invention is characterized by a jig for positioning copy material on the copy board of an offset print plate maker in order to make a photographic print plate bearing one or more images of the copy material. The positioning jig is characterized by a base having a top facing surface defining one or more positioning stops. Each of the one or more positioning stops includes a pair of mutually perpendicular side walls having a relatively low height with respect to the length of said side walls. Each positioning stop is formed such that it provides accurate positioning of the copy material without the positioning stop casting an image which is photographically perceptible by the plate maker.

Accordingly, it is an object of the present invention to provide an improved apparatus for positioning copy material on an offset print plate maker in order to make a photographic print plate bearing one or more images of the copy material.

Further, it is an object of the present invention to provide an attachment for plate makers which permits greater accuracy in alignment than using visual positioning lines and which also serves to save time in alignment of the ready copy. Ideally, such an attachment should have the capability to accurately align different sized documents for exposure to the camera in the plate maker, and also permit multiple exposures of the copy material by a simple step/repeat procedure.

A yet further object of the present invention is to provide an attachment for plate makers which permits accurate jig positioning of the copy material without the positioning stops casting an image which is photographically perceptible by the plate maker.

Related objects and advantages of the present invention will be apparent from the following figures and detailed description.

DESCRIPTION OF THE PREFERRED EMBODIMENT

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Figure 1:
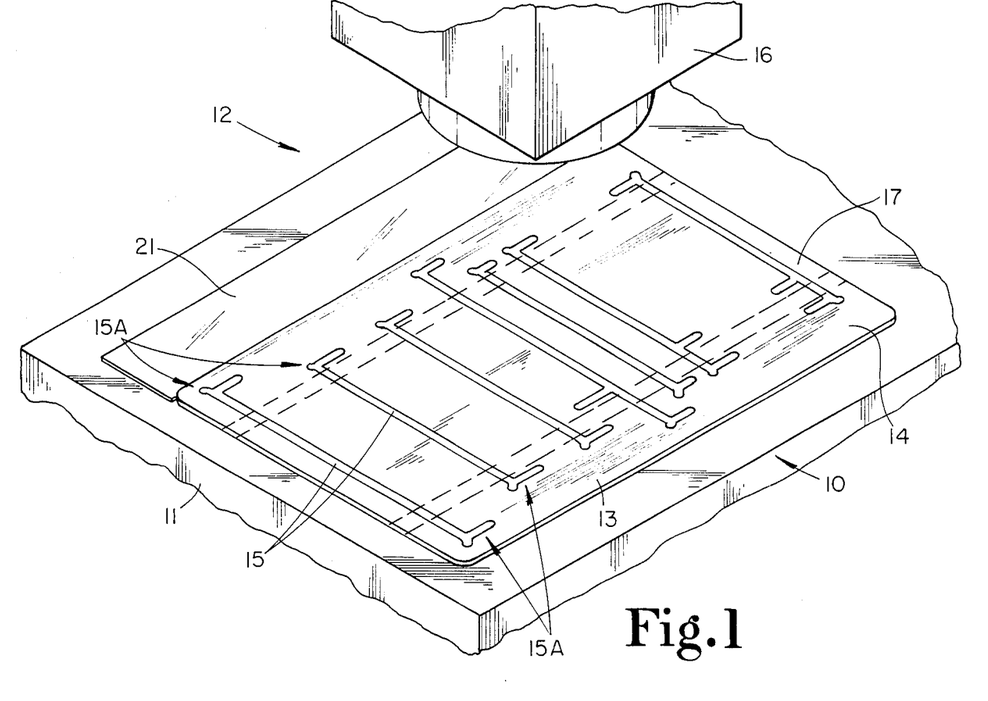
FIG. 1 is a fragmentary perspective view of the positioning jig apparatus of the present invention mounted upon the copy board of an offset print plate maker.

Referring now to the drawings, FIG. 1 shows the positioning jig of the present invention generally designated at 10 mounted upon the copy board 11 of an offset print plate maker 12. Positioning jig 10 is provided as part of a kit which also includes guide strip 21, a carrier 22 for business card sized copy material, a carrier 27 for odd sized copy material, a plurality of masks 26, target sheet 31, and holder 33.

Positioning jig 10 comprises a base member 13 having a generally rectangular shape when viewed in plan and formed from a 1/8" thick sheet of clear acrylic plastic. Seven parallel positioning slots 15, each including a pair of positioning stops 15A at the ends thereof, are integrally formed at measured spaced apart locations on the top facing surface 14 of base member 13 and serve to permit accurate positioning of copy material for exposure to camera 16. Three of the positioning slots 15 are provided with an additional positioning stop 15A at an intermediate measured location along their length for a purpose which will be made fully apparent later herein. Each of the positioning stops 15A are similarly formed, and a description of one suffices to describe the details of each. While not shown, it is to be understood that positioning lines are inscribed on the bottom surface of base member 13 by suitable means, such as silkscreening, and serve to aid the operator in visually locating positioning stops 15A. The bottom facing surface of base member 13 is further provided with four lengths of high tack/low tack adhesive tape 17 which permit base member 13 to be securely positioned on copyboard 11, and also easily removed therefrom. A guide strip 21 is positioned immediately adjacent to base member 13 on copy board 11, and serves as an aid in initially positioning base member 13 on copy board 11 in a manner fully described hereinbelow.

Figure 2:
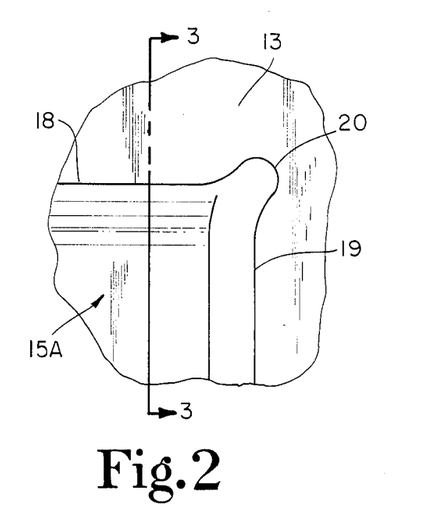
FIG. 2 is a fragmentary top elevation view, enlarged from FIG. 1, showing details of one of the positioning stops.
Figure 3:
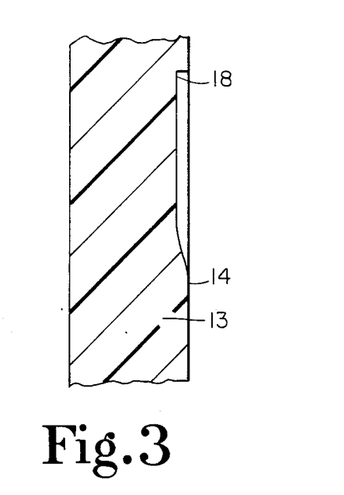
FIG. 3 is a fragmentary section view, taken along lines 3—3 of FIG. 2.

As seen in FIGS. 2 and 3, each of the recessed positioning stops 15A define a pair of mutually perpendicular vertical sidewalls 18 and 19. Further, each of the positioning stops located at the ends of slots 15 includes a curved wall portion 20 extending between sidewalls 18 and 19 and co-terminus therewith. Wall portion 20 serves to provide a clearance space around the corner of the copy material when it is positioned against positioning stop 15A, and thus eliminates any sharp corner where dirt could build. Sidewalls 18 and 19 serve as the surfaces against which abutting contact is made by the corresponding edges of rectangular shaped copy material. As earlier mentioned, positioning stops 15A are recessed from the top facing surface 14 of base member 13. This construction permits a plurality of positioning stops corresponding to copy material of different sizes to be provided on a single jig without substantially complicating the procedure for aligning the copy material.

Sidewalls 18 and 19 have an overall height which is sufficient to provide a definite stop against lateral movement of the copy material on base member 13. In this regard, it should be perceived that since positioning stops 15A are recessed, this will only occur if downward pressure is applied upon the copy material in the area adjacent the corner being located. Otherwise, the copy material will slide freely across the top surface of base member 13. The height of sidewalls 18 and 19 also cannot be too large, because they will cast shadows or otherwise cause lines to appear on the print plate. While in the preferred embodiment, the height of sidewalls 18 and 19 is in a range from 0.15" to 0.020", the sidewalls could have a height as small as 0.005" or as large as 0.060" and still function adequately.

In order to further reduce the problems caused by the photographic image of sidewalls 18 and 19, the top and bottom surfaces of base member 13 are frosted by blasting with an 80 grit aluminum oxide material. This process roughens the previously smooth surface of base member 13 so that it presents an irregular surface which randomly disperses incident light within base member 13. In addition, the frosted top surface tends to stick less to the copy material than a more smooth surface, thus increasing the ease with which the copy material may be positioned and removed from the jig.

Figure 4A:
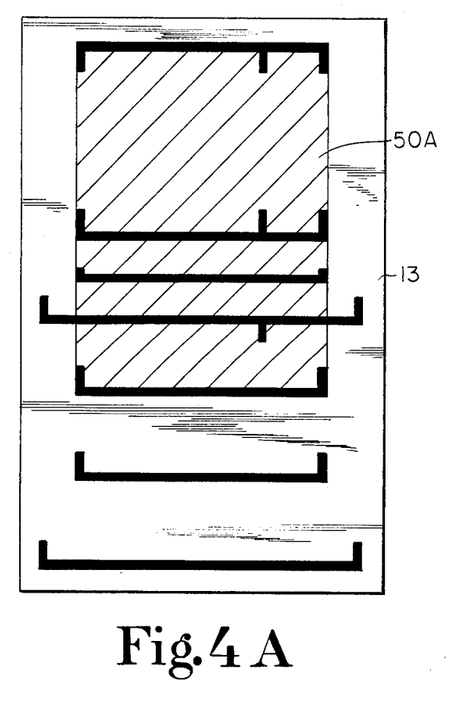
FIGS. 4A–E are top plan views showing the positioning of various standard sized copy materials on the jig apparatus of the present invention.
Figure 4B:
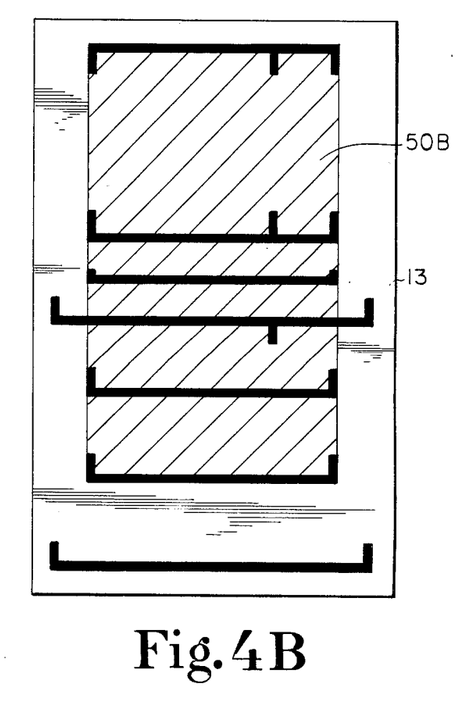
Figure 4C:
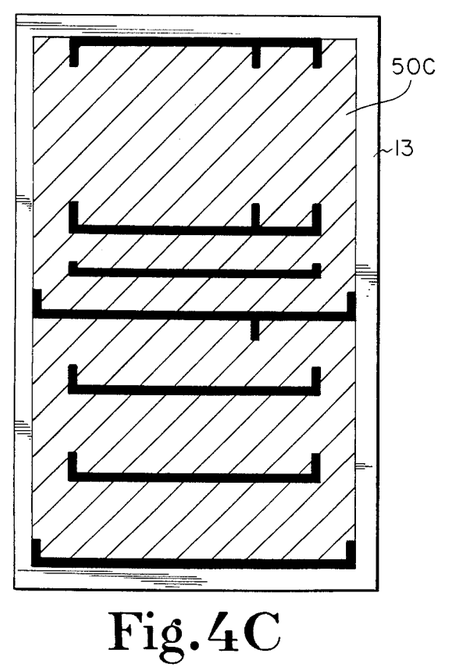
Figure 4D:
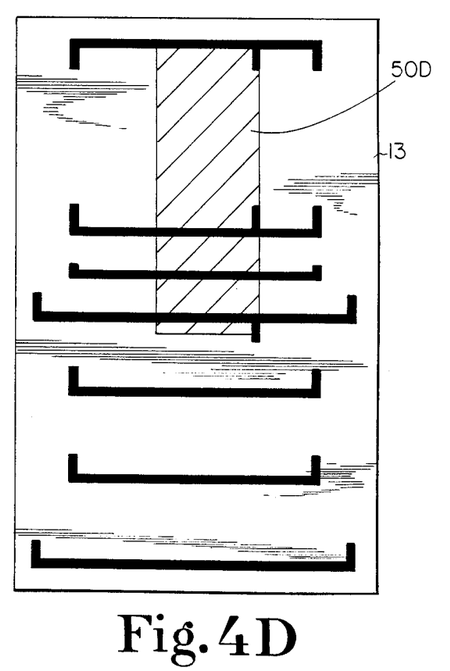
Figure 4E:
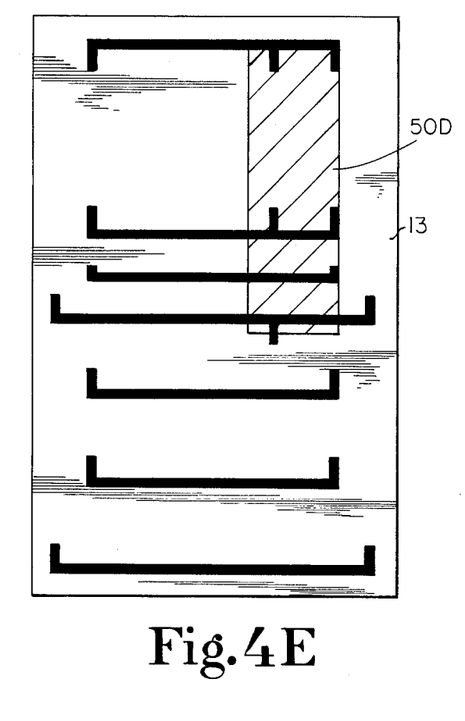

FIGS. 4A–4E depict the positioning of various standard sized copy material on base member 13 in making plates bearing a single exposure of the copy material. Thus, FIG. 4A depicts the positioning of an 8 and ½ by 11" sheet of copy material 50A. FIGS. 4B and 4C depict the positioning of copy material 50B and 50C having 8 and ½" by 14" and 11" by 17" sizes, respectively. It may be appreciated that the copy material in FIGS. 4A and 4B can be accurately positioned using any one of the four positioning stops corresponding to the corners of the copy material, while the copy material in FIG. 4C can be accurately positioned using either of two positioning stops corresponding to the bottom two corners of the copy material. FIGS. 4D and 4E depict the positioning of No. 10 size envelopes 50D for 8 and ½" by 11" sheet material run long way on center and long way right side, respectively.

Figure 5A:
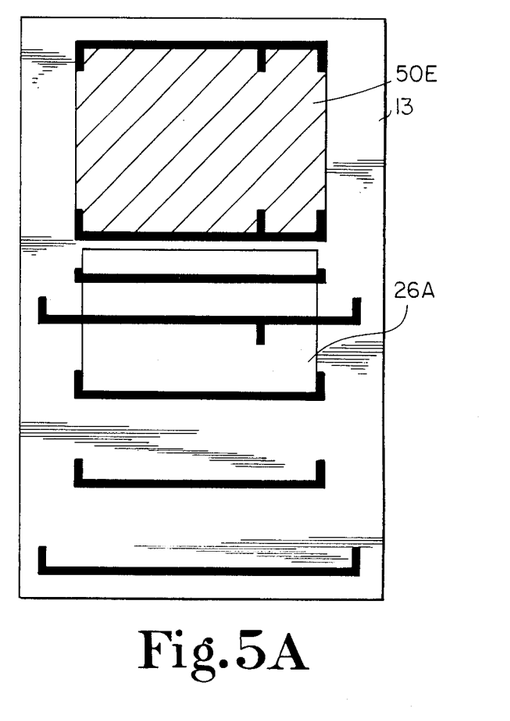
FIGS. 5A–B are top plan views depicting successive positions of the copy material and mask in making a print plate bearing two images of 5 and ½" by 8 and ½" copy material for printing on an 8 and ½" by 11" sheet.
Figure 5B:
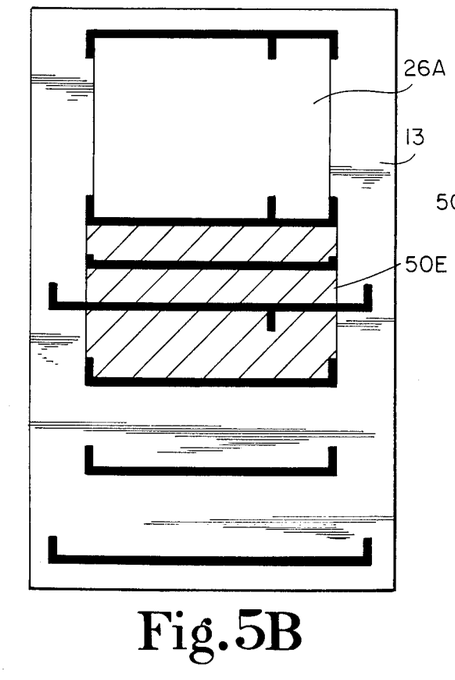
Figure 6A:
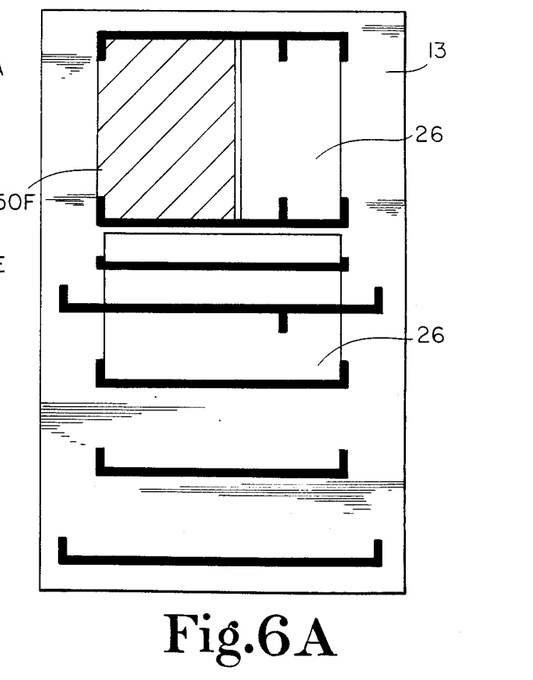
FIGS. 6A–D are top plan views depicting successive positions of the copy material and masks in making a print plate bearing four images of 4 and ¼" by 5 and ½" copy material for printing on an 8 and ½" by 11" sheet.
Figure 6B:
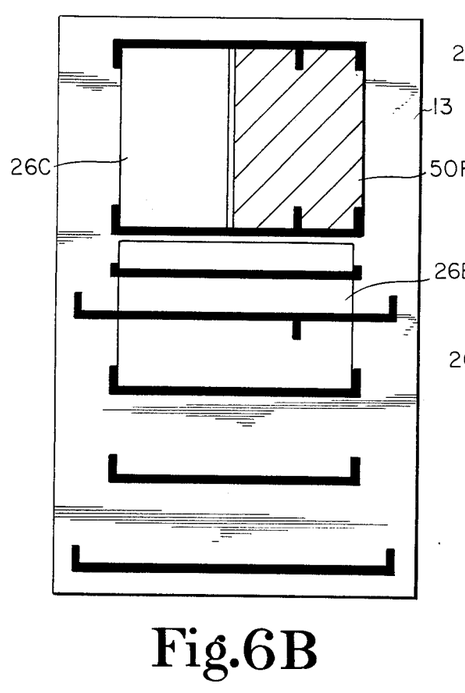
Figure 6C:
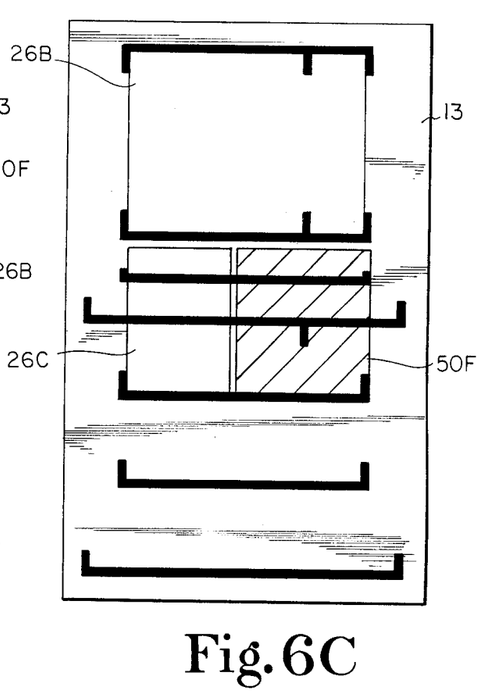
Figure 6D:
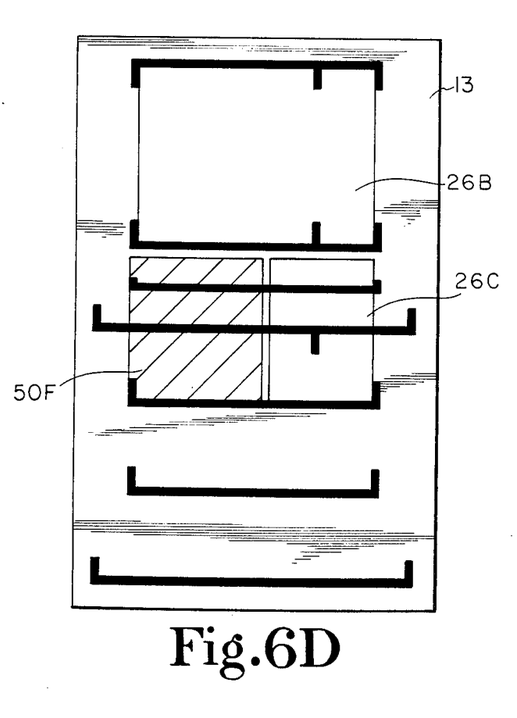

FIGS. 5A–B depict successive positions of the copy material and mask 26A in order to make two 5 and ½" by 8 and ½" images on 8 and ½" by 11" copy material 50E. Mask 26A is provided for masking a portion of the jig so as to permit only that portion of the plate which corresponds to the portional area occupied by the copy material to be exposed. Mask 26A is rectangular in shape, approximately 10 and ⅞" high and 8 and ¾" wide, and is made from a suitable opaque sheet material such as opaque vinyl. While not shown, a similar method is used to make two 8 and ½" by 11" images on 11" by 17" copy material. A masking sheet having a height of 8 and 7/16" and a width of 10 and 15/16" is provided for this purpose.

FIGS. 6A–D depict successive positions of the copy material and masks 26B and 26C in order to make four 4 and ¼" by 5 and ½" images on 8 and ½" by 11" copy material 50F. Masks 26B and 26C are formed similar to mask 26A, but differ in overall size. Mask 26B is approximately 8 and ¾" wide and 5 and 154 " high, while mask 26C is 6 and 15/16" high and 4 and 3/16" wide.

Figure 7:
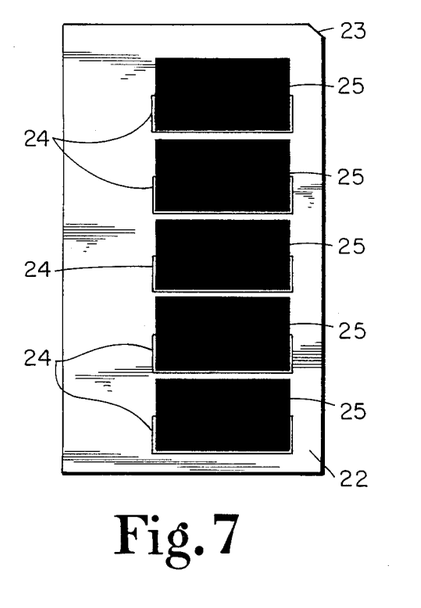
FIG. 7 is a top plan view of the carrier for business card size copy material included in the kit of the present invention.

FIG. 7 depicts carrier 22 in a top plan view. Carrier 22 is generally rectangular shaped except along notch 23 which serves to distinguish the aftermost side of the carrier. Carrier 22 includes five recessed positioning stops 24 aligned longitudinally on the top facing surface thereof. Each of the positioning stops 24 are identically formed and are similar to positioning stops 15A except for the absence of curved portion 20. Masks 25, which are identically formed, are positioned adjacent each of the stops 24 and are secured to the top surface of carrier 22 by suitable means, such as an adhesive. Each of the masks 25 is sized to mask an area which corresponds to slightly less than the size of a standard business card. Carrier 22 is preferably formed from a sheet of white vinyl and masks 25 are formed from an opaque vinyl sheet material.

Carrier 22 permits business card sized copy material to be positioned for multiple exposures by a simple step/repeat process. In order to use carrier 22, the carrier, with notch 23 at the top, is positioned on base member 13 adjacent the left 8 and ½ by 11 positioning stop. The copy material, i.e., a 2" by 3 and ½" size business card (not shown) is then positioned at the location corresponding to the bottom positioning stop and the first partial exposure of the plate is made. The copy material is then slid upwards to the next positioning stop and another partial exposure is made. The step is repeated until exposures have been made with the copy material positioned in all five positioning stops. It is to be noted that while carrier 22 is adapted for five partial exposures of the print plate, some plate material will not tolerate more than four partial exposures without serious deterioration of printing quality. Thus, a blank business card may be placed in the bottom positioning stop while the previous steps are accomplished at the other four positioning stops in order to produce a print plate from four partial exposures.

Figure 8:
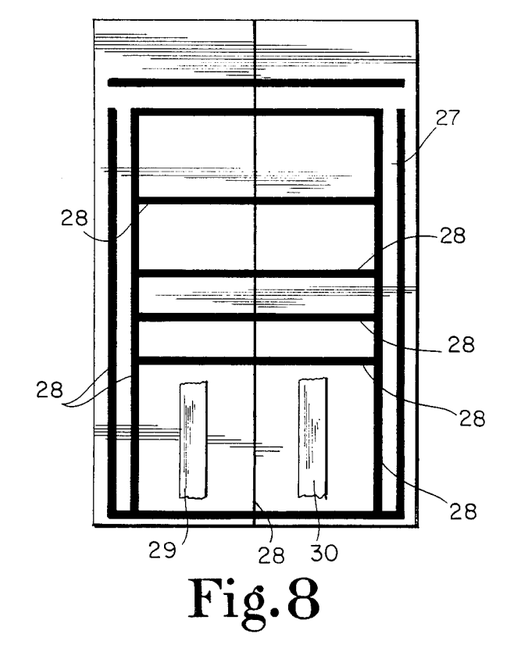
FIG. 8 is a top plan view of the carrier for odd sized copy material included in the kit of the present invention.

FIG. 8 depicts carrier 27 in a top plan view. Carrier 27 is rectangular shaped and has a size of 11" by 17". The top facing surface of carrier 27 is inscribed with a number of longitudinal and lateral positioning lines 28 which are inscribed at measured locations in order to aid in the positioning of odd sized copy material. Two strips 29 and 30 of double coated high tack/low tack adhesive tape are secured to the top facing surface and serve to permit copy material to be fixedly mounted on carrier 27 and easy removal therefrom. Carrier 27 is formed of white vinyl sheet material.

In order to use carrier 27 to position odd sized copy material, a center mark is made on the top and bottom of the copy material using a drop-out marker. The center marks on the copy material are then aligned with the centerline on the carrier and the top edge of the copy material is positioned by measuring down from the top of the carrier. The copy material is then mounted on the carrier with the low tack adhesive strips 29 and 30 fixedly securing the position of the copy material on carrier 27. The carrier with the copy material mounted thereon is then positioned on the 11" by 17" positioning slots of base member 13 and an exposure of the plate is made.

Figure 9:
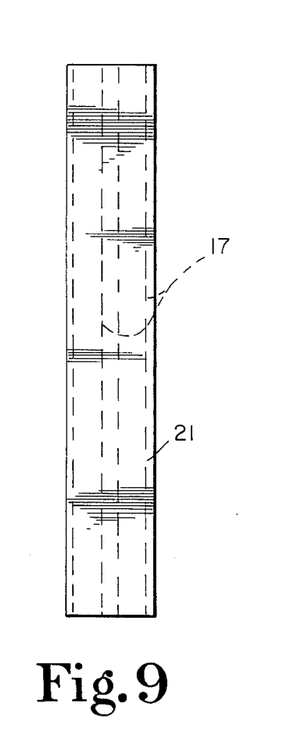
FIG. 9 is a top plan view of the guide strip included in the kit of the present invention.

FIG. 9 depicts guide strip 21 in a top plan view. Guide strip 21 is rectangular in shape and is formed of clear acrylic plastic. Guide strip 21 is 3" wide and has a length which is identical to the length of base member 13. Two strips 17 of double coated high tack/low tack adhesive are secured to the bottom facing surface of guide strip 21 for fixedly securing the position of guide strip 21 on copyboard 11 and permitting easy removal therefrom.

Figure 10:
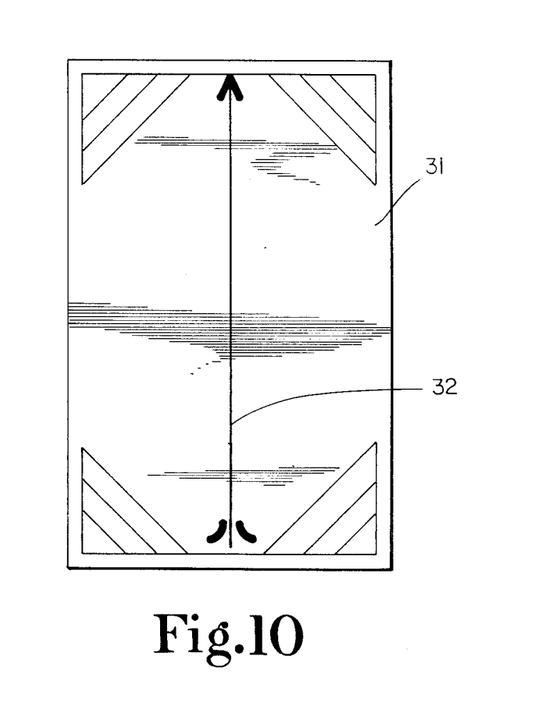
FIG. 10 is a top plan view of the target sheet included in the kit of the present invention.

FIG. 10 depicts target sheet 31 in a top plan view. Target sheet 31 is formed of a slick surface paper sheet having a rectangular shape of 11" by 17". An arrow 32 is inscribed on the top surface thereof coincident with the centerline of the sheet. Target sheet 31 is suitably inscribed at the corners thereof in order to serve as a further reference for measurement and positioning purposes.

In order to initially position and mount jig 10 on copyboard 11, the copyboard is first cleaned and inspected to ensure that it is secured from movement. The 100% line and center line (not shown) of the copyboard are located and the slot 15 corresponding to the topmost pair of positioning stops 15A on base member 13 is aligned directly over the 100% line of the copyboard with base member 13 positioned slightly off center. Next, target sheet 31 is positioned on the slot 15 corresponding to the bottom pair of positioning stops 15A, and an exposure is made. When the plate is developed, measurements are taken from the edge of the plate to arrow 32 at both the top and bottom thereof, and the lateral movement required to align the target arrow with the center of the plate is determined. At this point, a check may also be made to determine whether any adjustment is necessary to align the top slot 15 with the 100% line. Next, using the measurements previously taken, guide strip 21 is positioned on copyboard 11 by measuring over from the left border of base member 13 at the top and bottom thereof, and aligning the right border of guide strip 21 with these measured locations, or vice versa. Once guide strip 21 is accurately positioned and secured to copyboard 11, base member 13 is removed from the copyboard and repositioned immediately adjacent guide strip 21, and aligned top to bottom therewith. Another exposure may then be made using target sheet 31 in the manner previously described in order to verify the correct positioning of base member 13.

Figure 11:
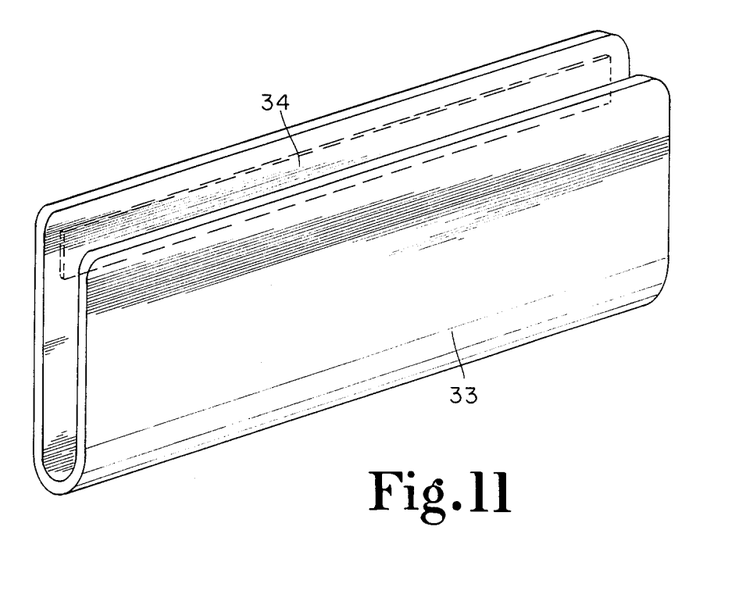
FIG. 11 is a perspective view of the holder included in the kit of the present invention.

FIG. 11 depicts a perspective view of holder 33 which is used to conveniently store the elements of the kit when not in use. Holder 33 is made from clear acrylic and includes a strip 34 of adhesive tape fixedly secured on the back side thereof that permits mounting holder 33 vertically in a convenient location, such as against the side of the copy board.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A positioning jig for positioning copy material on the copyboard of a photographic print plate maker, said plate maker used to make an offset print plate bearing an image of the copy material, comprising:
a base having a top facing surface and one or more positioning stops recessed within said base, each of said one or more positioning stops providing means, including a pair of mutually perpendicular side walls having a relatively low height with respect to the length of said side walls, for accurately positioning said copy material without said positioning stops casting an image which is photographically perceptible by said plate maker.

2. The positioning jig of claim 1 wherein said the vertical height of said side walls is less than 0.060 inches.

3. The positioning jig of claim 2, wherein said positioning stops are translucent.

4. The positioning jig of claim 3, wherein said positioning stops are formed of a plastic material.

5. The positioning jig of claim 4, wherein said plastic material is acrylic.

6. The positioning jig of claim 5, wherein said base is integrally formed from an acrylic sheet, and said top facing surface is made sufficiently irregular to permit light striking said surface to become diffused in said base.

7. The positioning jig of claim 6, wherein said top facing surface of said base is made sufficiently irregular by blasting with an 80 grit aluminum oxide material.

8. The positioning jig of claim 7, wherein said positioning stops have laterally recessed corners which provide a clearance space adjacent the corner of said copy material when said copy material is positioned against said stop.

9. The positioning jig of claim 8, wherein the bottom facing surface of said base includes a length of adhesive tape having a low tack adhesive on one side thereof for permitting said base to be removably mounted to said copyboard.

10. A positioning jig for positioning copy material on the copyboard of a photographic print plate maker, said plate maker used to make an offset print plate bearing an image of the copy material, comprising:
a base having a top facing surface and a plurality of positioning stops recessed within said base, each of said positioning stops having means, including a pair of mutually perpendicular side walls having a relatively low height with respect to the length of said side walls, for permitting said copy material to be positioned flat upon said top facing surface with said copy material also positioned over one or more of said positioning stops.

11. The positioning jig of claim 10, wherein the vertical height of said side walls is less than 0.060 inches.

12. The positioning jig of claim 11, wherein said positioning stops are formed of a translucent material.

13. The positioning jig of claim 12, wherein said translucent material is a plastic.

14. The positioning jig of claim 13, wherein said translucent material is acrylic.

15. The positioning jig of claim 14, wherein said base is integrally formed from an acrylic sheet, and said top facing surface is made sufficiently irregular to permit light striking said surface to become diffused in said base.

16. The positioning jig of claim 15, wherein said top facing surface of said base is made irregular by blasting a transparent acrylic sheet with an 80 grit aluminum oxide material.

17. The positioning jig of claim 16, wherein said positioning stops have laterally recessed corners which provide a clearance space adjacent the corner of said copy material when said copy material is positioned against said stop.

* * * * *

UNITED STATES PATENT AND TRADEMARK OFFICE
CERTIFICATE OF CORRECTION

PATENT NO. : 4,525,062

DATED : June 25, 1985

INVENTOR(S) : Alfred Leon Clark

It is certified that error appears in the above-identified patent and that said Letters Patent is hereby corrected as shown below:

In column 5, line 18, the phrase "8 and 3/8" wide and 5 and 154" high" should read -- 8 and 3/8" wide and 5 and 3/8" high --.

Signed and Sealed this

Twenty-ninth Day of October 1985

[SEAL]

Attest:

Attesting Officer

DONALD J. QUIGG

Commissioner of Patents and Trademarks—Designate